United States Patent [19]

Furman

[11] Patent Number: 4,535,428

[45] Date of Patent: Aug. 13, 1985

[54] MULTI-PORT REGISTER IMPLEMENTATIONS

[75] Inventor: Anatol Furman, Jericho, Vt.

[73] Assignee: International Business Machines Corporation, Armonk, N.Y.

[21] Appl. No.: 474,071

[22] Filed: Mar. 10, 1983

[51] Int. Cl.³ .............................................. G11C 11/40
[52] U.S. Cl. ..................................... 365/230; 365/189
[58] Field of Search ............... 365/189, 230, 238, 239, 365/240, 233

[56] References Cited

U.S. PATENT DOCUMENTS

| | | | |
|---|---|---|---|
| 3,801,965 | 4/1974 | Keller et al. ......................... | 365/189 |
| 3,896,417 | 7/1975 | Beecham .............................. | 364/900 |
| 4,078,261 | 4/1978 | Millhollan et al. .................. | 365/189 |
| 4,090,258 | 5/1978 | Cricchi ................................. | 365/184 |
| 4,106,109 | 8/1978 | Fassbender ......................... | 365/238 |
| 4,183,095 | 1/1980 | Ward .................................... | 365/189 |
| 4,314,164 | 2/1982 | Tin et al. ............................. | 307/243 |

Primary Examiner—Joseph A. Popek
Attorney, Agent, or Firm—Francis J. Thornton

[57] ABSTRACT

The present invention is especially directed towards a memory array which utilizes means for comparing the address inputs of word decoders in the system such that, when a compare occurs, selected ones of the word decoders are disabled to prevent a multiple read and selected higher order read heads are inhibited while switching the output data onto all of the output lines having the same address as the uninhibited word decoder.

10 Claims, 5 Drawing Figures

MULTI-PORT REGISTER IMPLEMENTATIONS

FIELD OF THE INVENTION

This invention relates to a random access read/write memory system and, more particularly, to a high density system which utilizes a multiple read/write system.

BACKGROUND OF THE INVENTION

In selected micro-processors, some of which require high speed registers as local storage, it would be desirable if each register can be separately addressable from a multiplicity of data-in ports for a write and separately addressable to a multiplicity of data-out ports for a read. The data, in the register, thus would be addressable at any data-in port and readable at any data-out port. Such multi-port devices might comprise three bit memory configurations, arranged with independent read and write addressing, so that upon a write, the identical information is written into each configuration, in the identical address position, and then sequential writes will write into the different port addresses, in parallel, so that each of the three configurations contain the same information in the same address positions, then a simultaneous read of the three configurations in three different positions—three different addresses—will present three different words to each of the three different out ports. When an attempt is made to merge the information and read it from a single configuration problems arise. One such problem, with such arrangements, is that there is no restriction which prohibits all three read heads from trying to read data from the same cell at the same time. Since some of the cells must be significantly larger because of the simultaneous read, the cell size and the array size is double or triple; thus, such multi-port circuits have generally been avoided. Until the present invention, there has been no satisfactory way of preventing multiple reads in a single cell while delivering that cell data to each port with a multiple read.

BACKGROUND ART

In U.S. Pat. No. 3,896,417 to D. Beecham, there is disclosed an arrangement whereby a plurality of shift registers is arranged together with a comparator to compare the rotational positions of an input write ring counter and an input read ring counter so that when a matched signal is developed, the write counter is disabled.

In U.S. Pat. No. 4,183,095 to W. P. Ward, there is described a high density memory system that uses serially reading and writing data from and into selected memory elements by using a comparator to control the operating mode of the memory system. Thus, the read and write mode is selected by comparing the signal on a function conductor with the signal on a clock conductor.

Finally, in U.S. Pat. No. 4,078,261 to M. S. Millhollan et al, there is described a system in which read circuitry is disabled during a write cycle.

SUMMARY OF THE INVENTION

The present invention is especially directed towards a memory array which utilizes means for comparing the address inputs of word decoders in the system such that, when a compare occurs, selected ones of the word decoders are disabled to prevent a multiple read and selected higher order read heads are inhibited while switching the output data onto all of the output lines having the same address as the uninhibited word decoder.

From the foregoing, it can be seen that an object of the present invention is to provide an improved memory system having an increased density.

Another object of the present invention is to provide a memory system which results in better power performance as well as a smaller size.

A further object of the present invention is to prevent multiple reads in multi-port register arrays while still accessing that information.

These and other objects of the present invention will become more apparent when taken in conjunction with the following descriptions and drawings wherein there is set forth a specific embodiment of the present invention.

DESCRIPTION OF THE PREFERRED EMBODIMENT

A multi-port register stack is intrinsic to selected micro-processors, some of which require 16 high speed registers as local storage. Each register is required to be at least 32 bits long, (and may be even longer if parity is required), for the 32 bit processor. Thus, it is convenient to consider the register stack as a 512 bit static memory with 16 words of 32 bits each; where every read or write is a 32 bit wide word.

The term "multi-port" as used herein refers to the requirement that each register must be separately addressable from a multiplicity of data-in ports (for a write), or each register must be separately addressable to a multiplicity of data-out ports (for a read). The term "port" refers to the number of ways that a given register (or bit in a register) may be addressed; but any data in any register must be available (addressable) from any port.

To more clearly demonstrate the action of a multi-port register stack, consider the following implimentation of a multi-port register stack which requires three reads. Three single port 512 bit memories with independent read and write addressing are arranged so that on a write, the identical information is written into each memory in the identical addressed position. Then, sequential writes will write the same information into each memory into the different port addresses in parallel, so that each of the three memories contains the same information in the same address positions. Finally, a simultaneous read of the three memories in three different addresses will present three different words to each of the three different output ports.

Figure 1:
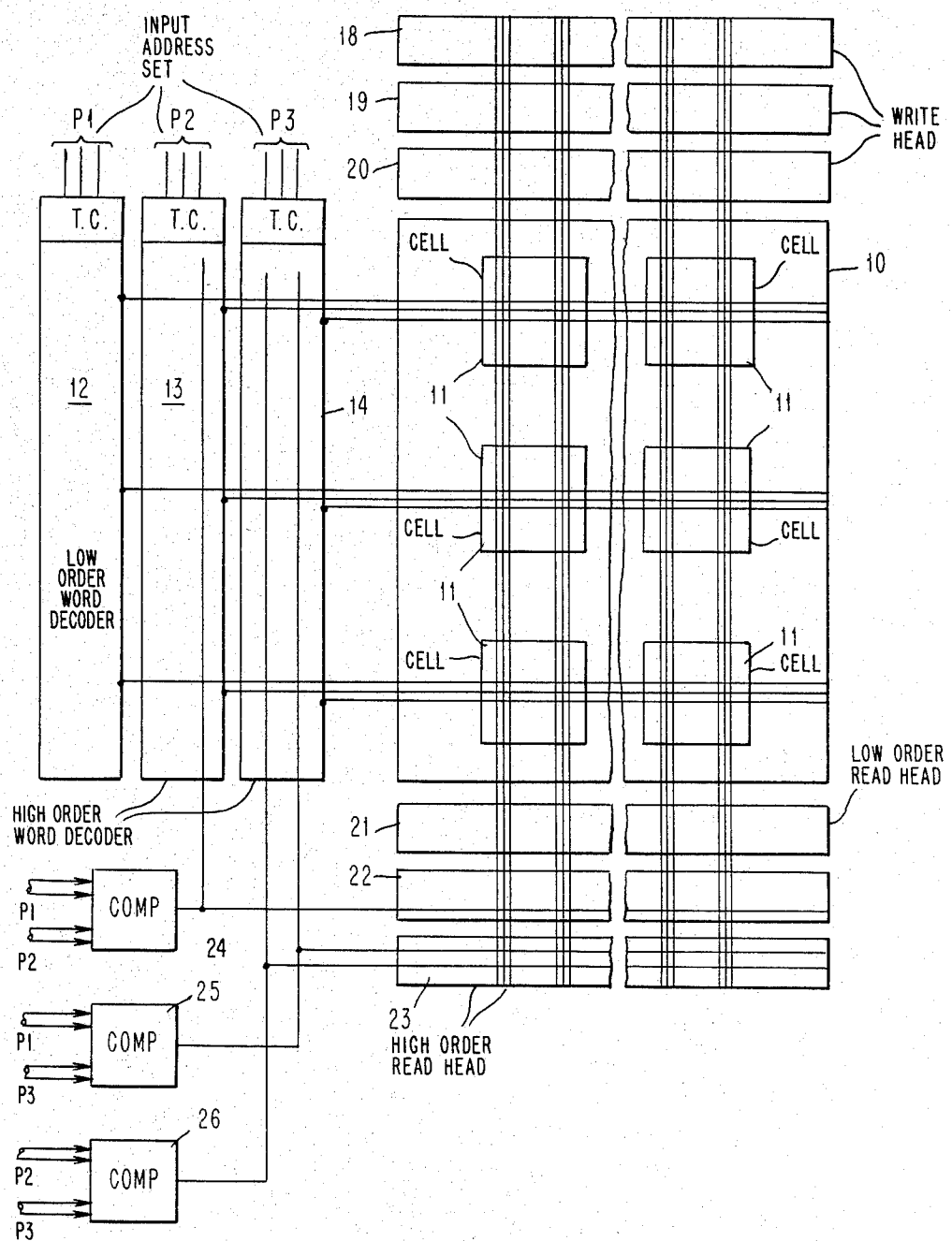
FIG. 1 illustrates in block schematic form a complete array of the system employing the present invention.

The present implementation is especially exemplified in FIGS. 1 and 2. Referring now to FIG. 1 of the drawing, there is shown a block diagram of a multi-port memory system employing the present invention.

The system has an array 10 of storage cells 11, each cell of which is coupled to a set of word lines and a set of differential bit lines. Each set of word lines and each set of differential bit lines is equal in number to the number of ports in the system. For purposes of example only, a three-port system will be described. In this case, each cell is coupled to three word lines and six bit lines, i.e., three pairs of differential bit lines arranged orthogonal to the word lines. The word lines are coupled to the three respective sets of word decoders 12, 13 and 14 driven by respective sets of input address lines P1, P2 and P3. Thus, FIG. 1 shows unit cells 11 (each one bit) of a three port (three read and three write ports). If the cell 11 is replicated 32 times horizontally, (only two are shown in the figure) it represents one word of the register stack. Replicated 16 times vertically, (only three are shown in the figure) it represents one bit of the register stack.

As shown in FIG. 2, transistors 30, 31, 32 and 33 constitute the memory cell or latch, while transistors 34 and 35 differentially couple the bit lines 40 and 41 to the cell for reads and writes. This is basically the well known, classic six device cell.

Transistors 36, 37, 38 and 39 constitute the bit line coupling for the additional two ports, i.e., the additional two pairs of bit lines. Each cell is selected by one of three word lines 46, 47, 48 and read from or written into by its corresponding bit line pair. Two other cells in two other register words aligned vertically under this cell are also selected by their word lines, and read or written onto their respective bit line pairs from their respective ports.

Hitherto fore there was no restriction to prohibit all three ports from trying to read data from the same cell at the same time. To sink all of the current that the bit line coupling devices can deliver without changing state, transistors 30 and 31 must be large. That is, they must not permit data to be lost on a multiple read disturb. If three simultaneous reads are permitted in the same cell, then transistors 30 and 31 need be three times as large as if only one read is permitted to occur in that cell, but increasing their size three-fold represents a doubling of the cell size, and thus the array size.

The present invention corrects all these problems and comprises adding circuits to inhibit the reading of the unselected lines, while simultaneously switching data from the one selected read head into the output ports of the other two multiply selected (but inhibited) read heads. In this implimentation, the addition of 0.01 SQMM of additional circuitry saves at least 2 SQMM of array area and permits faster performance.

The bit lines are coupled to suitable write heads 18, 19 and 20 and to three read heads 21, 22 and 23 of which read heads 22 and 23 also contain multiplexer circuits. Those heads 22 and 23 which contain multiplexer circuits are referred to as higher order circuits, with head 23 being a higher order than head 22, which, in turn, is a higher order than head 21. Similarly, these write decoders coupled to the comparator circuits 24, 25 and 26 are referred to as higher order circuits; with decoder 14 being of a higher order than decoder 13, which is, in turn, of a higher order than decoder 12. There is also provided in accordance with the present invention three comparator circuits 24, 25 and 26, each of which are coupled to selective sets of the word decoder input address lines, to one or another of the high order word decoders 13 and 14, and to one or the other of the high order read heads 22 and 23, for comparing the address inputs to the word decoders, and, in the event of a compare, inhibiting the selected higher order word decoders and disabling the selected higher order read heads. In this way, the output data from the cell is transmitted only via the output read heads having the same address as uninhibited word decoders.

Figure 2A:
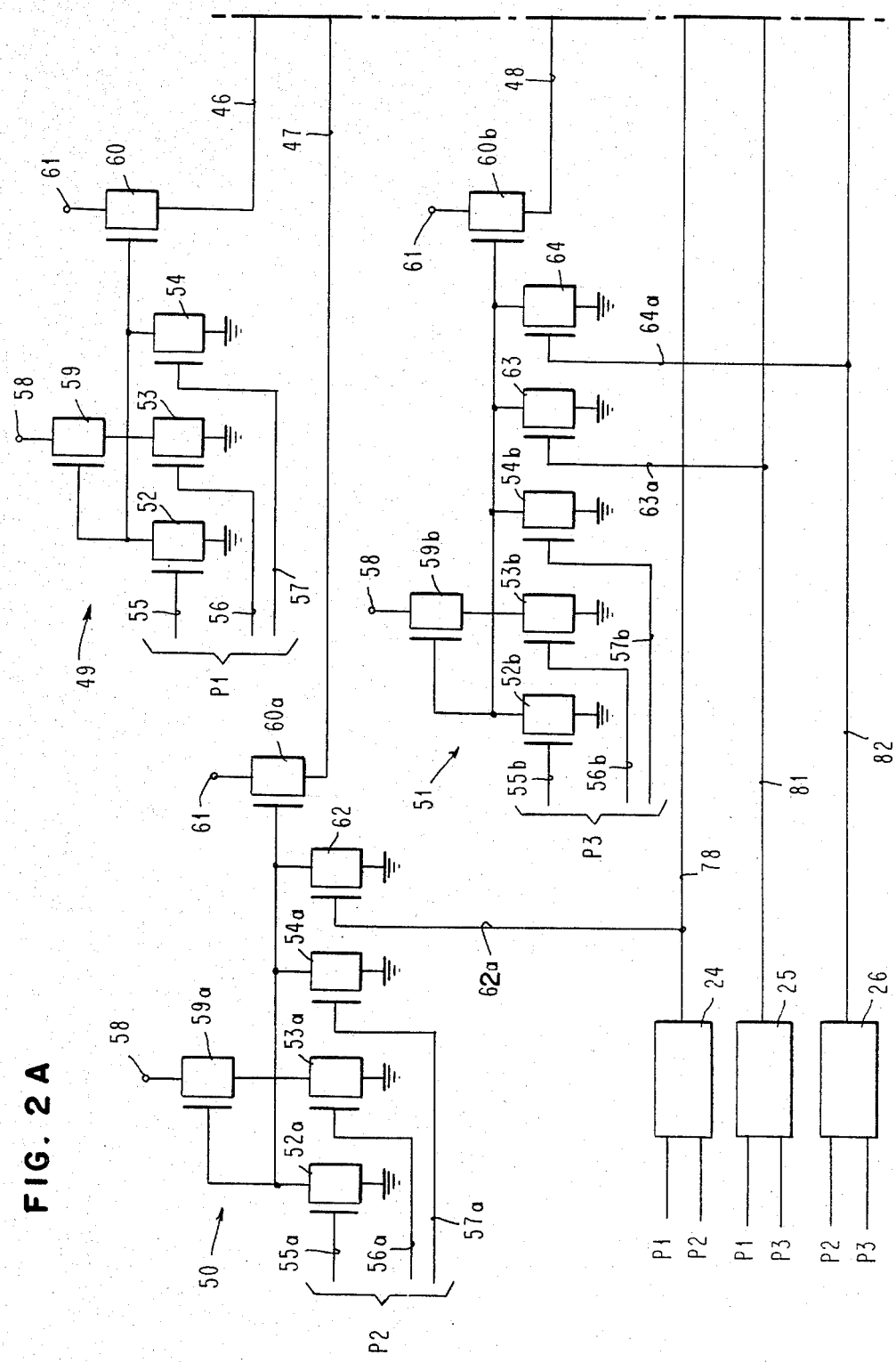
FIGS. 2A and 2B illustrate the array of FIG. 1 with typical detailed circuits for the word decoders and one of the cells of the array.
Figure 2B:
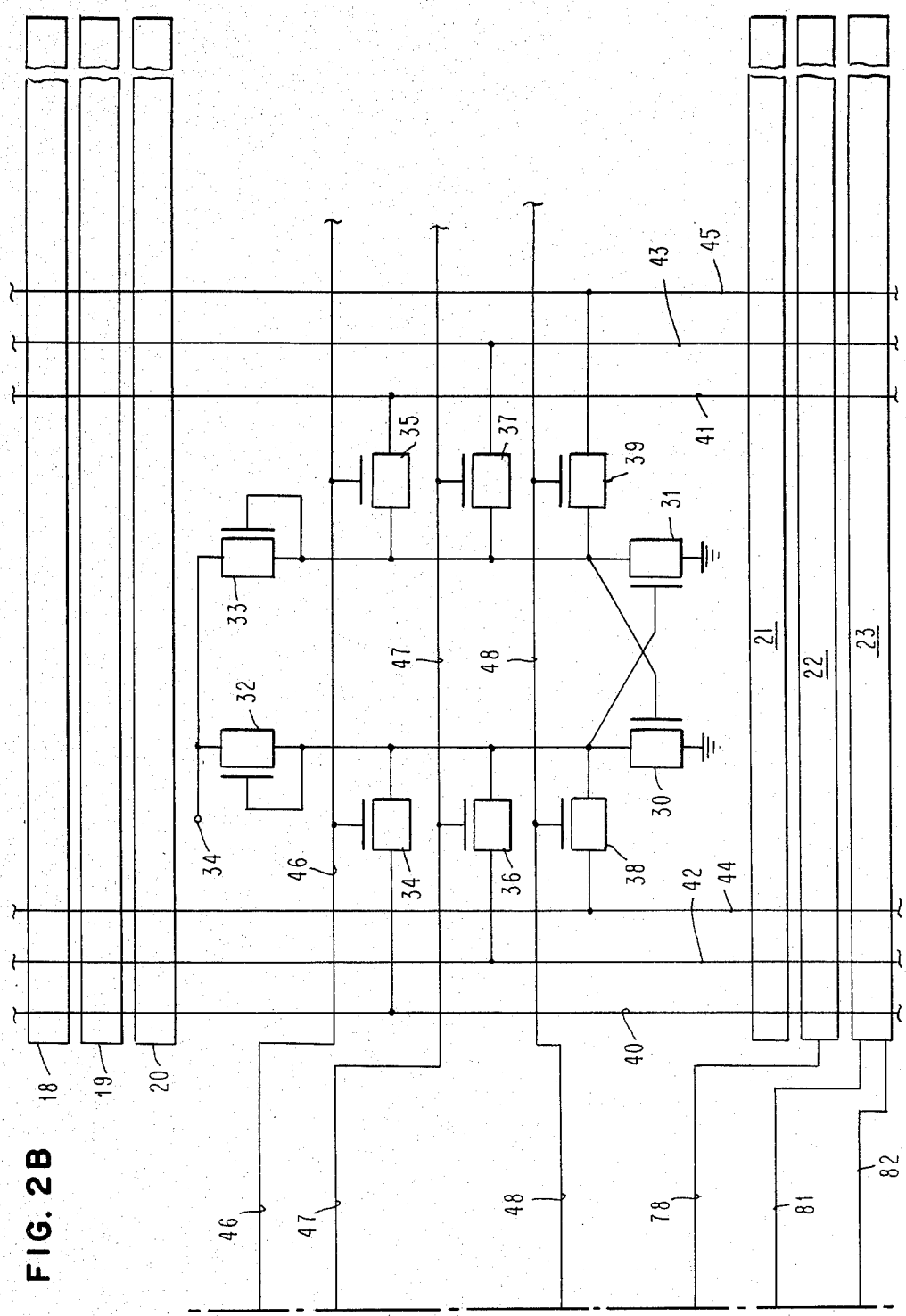

FIG. 2 illustrates in greater detail one of the cells 11 and its associated word decoders and for convenience is shown in two parts, FIG. 2A and FIG. 2B.

The cell 11 comprises a pair of cross coupled transistors 30 and 31 having their sources coupled to ground and their drains coupled through respective transistor loads 32 and 33 to a voltage source 34. The drains of the transistors 30 and 31 are also coupled through respective bit line transistors to respective bit lines. Thus, the drain of transistor 30 is coupled through bit line transistors 34, 36 and 38 to respective bit lines 40, 42 and 44 while the drain of transistor 31 is connected through bit line transistors 35, 37 and 39 to respective bit lines 41, 43 and 45.

The operation of such cross coupled cells is well known to the art and need not be described here. However, it basically depends upon the state of the transistors of 30 and 31 such that a differential signal is set up on the bit line pairs attached to the particular cell. Thus, for example, if the transistor 30 is off and the transistor 31 is turned on then the active bit lines coupled to the transistor 30 would be high and the active bit lines coupled to the transistor 31 would be pulled low, thus setting up a differential voltage on each of the three pair of bit lines 40, 41; 42, 43; and 44, 45 which may be coupled to the cell through an active bit line transistor. The differential voltage on the selected bit lines can be read, at any time after a write, by suitable read heads 21, 22 and 23. This system, therefore, uses a time-multiplex read and write. That is, the read and write operations are sequential and not simultaneous.

It, of course, should be understood that although the described embodiment is so limited the invention is not so limited and can be applied to simultaneous read/write operations.

The gates of the bit line transistors are connected in pairs 34, 35; 36, 37; and 38, 39; to respective word lines 46, 47 and 48. Thus, the gates of transistors 34 and 35 are connected to word line 46. The gates of bit line transistors 36 and 37 are connected to the word line 47 and the gates of bit line transistors 38 and 39 are connected to the word line 48.

These word lines are in turn coupled to a respective one of the selected word decoders 49, 50 and 51. These word line decoders are, of course, just one of each of the sets of word decoders contained in the word decoders 12, 13 and 14 respectively. Each word decoder is basically comprised of a plurality of input decode transistors, each of which has its gate coupled to a respective address line. In this case it will be presumed, for purposes of explanation only, that three addresses are employed. Thus, decoder 49 comprises of three input decode transistors 52, 53 and 54 having their gates coupled to respective address lines 55, 56 and 57 which will be collectively referred to as address P1. The sources of the input transistors 52, 53 and 54 are coupled to ground and their drains are coupled to a voltage source 58, through a load 59, and are also coupled to the gate of a switching transistor 60 whose drain is coupled to a voltage source 61 and whose source is coupled to the word line 46.

Of course, it should be understood that if more than three addresses are required or used in the system, then additional input decode transistors equal to the number of input address lines would be used in such decoders.

Such word decoders generally operate as follows. If any one or all of the address lines 55, 56 and 57 has a positive signal thereon, say address line 55 is high, the device 52 is on causing the gate of device 60 to be grounded. Thus, the device 60 is off and the address line 46 is off. When all of the input addresses, lines 55, 56 and 57 are negative then the device 60 is on and the word line 46 is high since it is now coupled through device 60 to the voltage source 61. When the word line 46 is high the bit line devices 34 and 35 are on and information in the cell, i.e., the state of the cross coupled devices 31 and 32 is differentially received by the bit line pair 40 and 41 which are now coupled to the cell through the bit line devices 34 and 35.

The other decoders 50 and 51 are substantially identical to the decoder 49 and operate in identical fashion except that decoder 50 has one additional device 62 in parallel with the address decode devices 52a, 53a and 54a and decoder 51 has two additional devices 63 and 64 which are in parallel with the input address decode devices 52b, 53b and 54b. The gate of the additional device 62, in decoder 50, is coupled to the output of the first comparator circuit 24 while the gate of the first additional device 63, in decoder 51, is coupled to the output of the second comparator circuit 25 and the gate of the second additional device 64, in decoder 51, is coupled to the output of the third comparator circuit 26.

For the sake of convenience, the input address lines 55, 56 and 57, to decoder 49, will collectively be referred to as address set P1. The input decode address lines 55a, 56a and 57a, to the decoder 50, will collectively be referred to as address set P2 and the input address lines 55b, 56b and 57b, to the decoder 51, will be collectively referred to as address set P3.

These address lines, in addition to being coupled to respective decoders, are also coupled to respective ones of the comparator circuits 24, 25 and 26. Thus, for example, comparator circuit 24 has the address sets P1 and P2 introduced thereto while comparator 25 has the address sets P1 and P3 introduced thereto and comparator 26 has the address sets of P2 and P3 introduced thereto.

In these comparator circuits the address sets are compared and, if a comparison is found, a suitable and positive output signal is transmitted from the comparator. For example, a comparison between address sets P1 and P2 causes a positive signal to be transmitted from comparator 24 to the gate of the additional device in the decoder; in this case, device 62 in decoder 50. This positive signal causes device 62 to turn on and to deactivate the word line 47. This effectively disables the decoder 50 and prevents it from acting on input address set P2. Similarly, if a comparison appears between address sets P1 and P3, then device 63 in decoder 51 is turned on and the word line 48 is deactivated. Again, if the address sets P2 and P3 have a comparison device 64 also in decoder 51 to be turned on and again the word line 48 would be deactivated. In this case, positive signs from either comparator 25 or 26 will effectively disable to decoder 51.

Simultaneously, the output of the comparator circuits is transmitted to the higher order read heads, 22 and 23, to selectively deactivate one or both of these higher order read heads 22 and 23. For example, if only addresses P1 and P2 compare, then only the higher order read head 22 is deactivated and read heads 21 and 23 are active. Similarly, if only addresses P2 and P3 compare, then only the higher order read head 23 is deactivated and read heads 21 and 22 are both active. Finally, if all these addresses compare, both read heads 22 and 23 are deactivated and only a single read head, i.e., head 21 is active. Of course, it must be clearly understood that different addresses are directed to and activate different cells and that the only time a problem arises is when the cell is being addressed by two or more identical addresses.

Thus, the higher order read heads are prevented from trying to read data from the cell at the same time and devices 30 and 31 of cell 11 need not be enlarged since the current through the cell will not be excessive.

Figure 3:
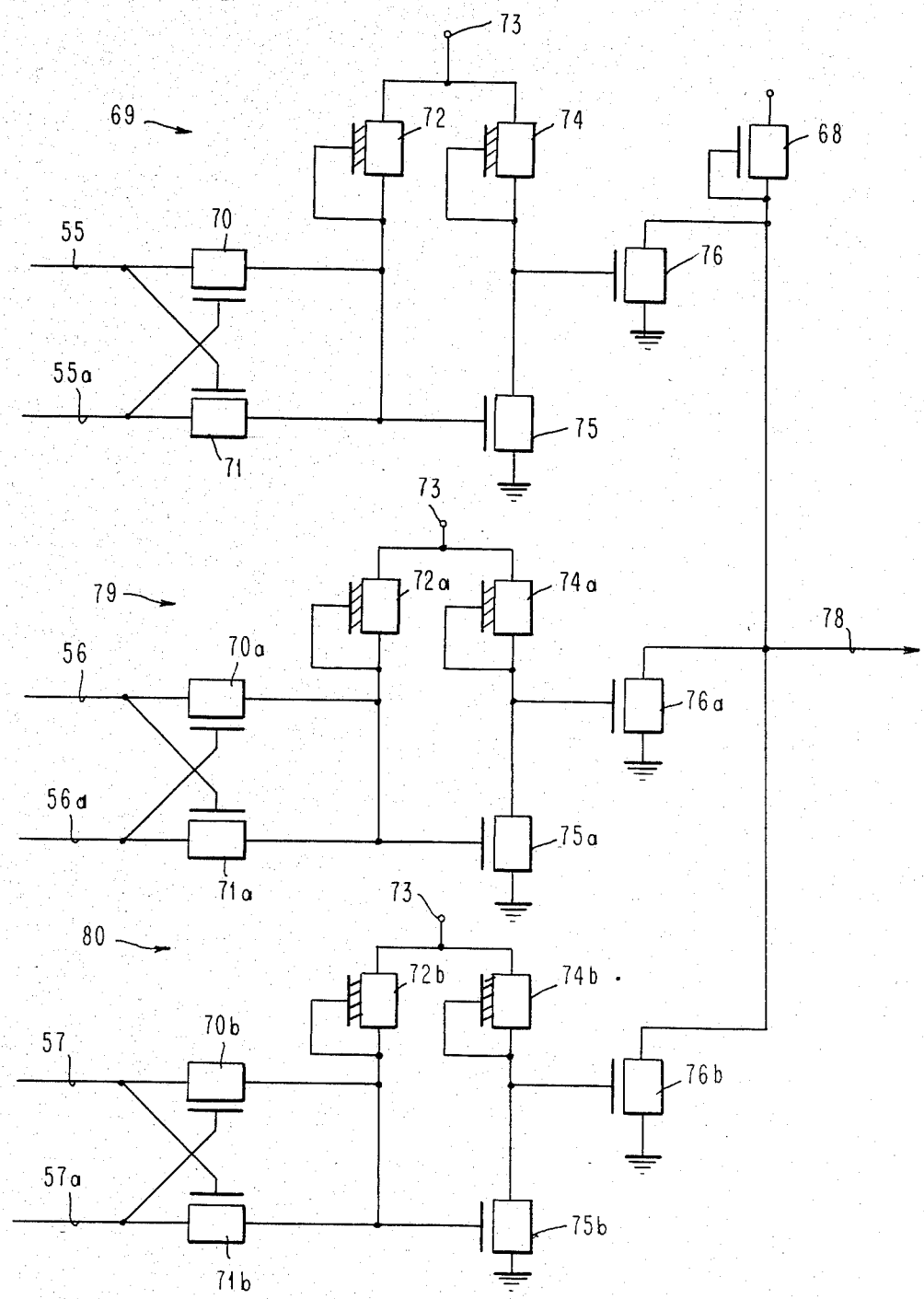
FIG. 3 illustrates a preferred embodiment of a comparator circuit for use in FIG. 1.

Turning now to FIG. 3, comparator circuit 24 will be described in greater detail as to its construction and operation.

FIG. 3 shows in detail the circuitry comprising the comparator circuit 24 of FIGS. 1 and 2. Basically, this comparator circuit 24 comprises the three exclusive-OR circuits 69, 79 and 80, each having a compare output feeding into a three-way NOR (devices 76, 76a and 76b) using negative logic to get an AND function. The compares are implemented in low power logic preferably at the instruction address register where the addresses are stored. The net result is that only one read in a cell is guaranteed and the cell transistors 30 and 31 may be reduced in size by a factor of three. The bit lines become shorter and the bit line parasitic capacitance significantly reduced such that the rise and fall times of the bit lines are correspondingly reduced.

As noted above the compare circuit 24 requires three exclusive-OR circuits 69, 79, and 80 each of which does a bit-by-bit address compare. Thus address lines 55 and 55a feed into a first exclusive-OR circuit 69 comprising cross coupled transistors 70 and 71 coupled through and having their sources coupled, through a load transistor 72, to a voltage source 73 and to the gate of an inverter transistor 75 whose source is grounded and whose drain is coupled through a second load transistor 74 to the voltage source 73. The drain of transistor 75 is also coupled to the gate of a first transistor 76 of the three-way NOR. The source of transistor 76 is grounded and its drain is connected to the P1 and P2 inhibit transfer line 78, which lead from the comparator 24 to the read head 22, and is connected to the inhibit line 62a leading to the word decoder 50.

The other bit by bit comparator circuits 79 and 80 shown in FIG. 3 are substantially the same as circuit 69 described in conjunction with the input address lines 55 and 55a. However, in this case, different address lines would be introduced into the circuits. Thus, the first circuit 69 described above is replicated three times since three different address lines set need to be compared for this example. Circuit 79 is substantially identical to circuit 69 except that the input address lines are lines 56 and 56a respectively. Similarly, circuit 80 is also identical to circuits 69 and 79 except that the input lines are address lines 57 and 57a respectively. In this way, an address by address comparison is made between the P1 address inputs and the P2 address inputs. Any compare between all of the inputed address lines 55 and 55a, or 56 and 56a, or 57 and 57a, will cause line 78 to go positive and introduce a positive signal onto line 62a. This positive signal on line 62a will cause device 62 to be turned on pulling down the input to the transistor 60a causing the word line 47 to be turned off.

Simultaneously, the input line 78 also deactivates the read head 22 as will be described in conjunction with FIG. 4.

Comparator 25 is similarly arranged except that it compares the addresses P1, introduced into address decoder 49, with the addresses P3, introduced in address decoder 51, and its input line 81 feeds not only the read head 23, but also feeds line 63a leading to device 63 in the word decoder 51.

Comparator circuit 26 is identical in construction to comparator circuits 24 and 25 except that it compares the addresses P2, introduced to the word decoder 50, with those addresses P3, introduced into the word decoder 51. Its output line 82 feeds both the read head 23 and the inhibit line 64a leading to device 64 in the word decoder 51. A positive signal on either lines 81 or 82 will inhibit the read head 23 and the word line decoder 51.

Figure 4:
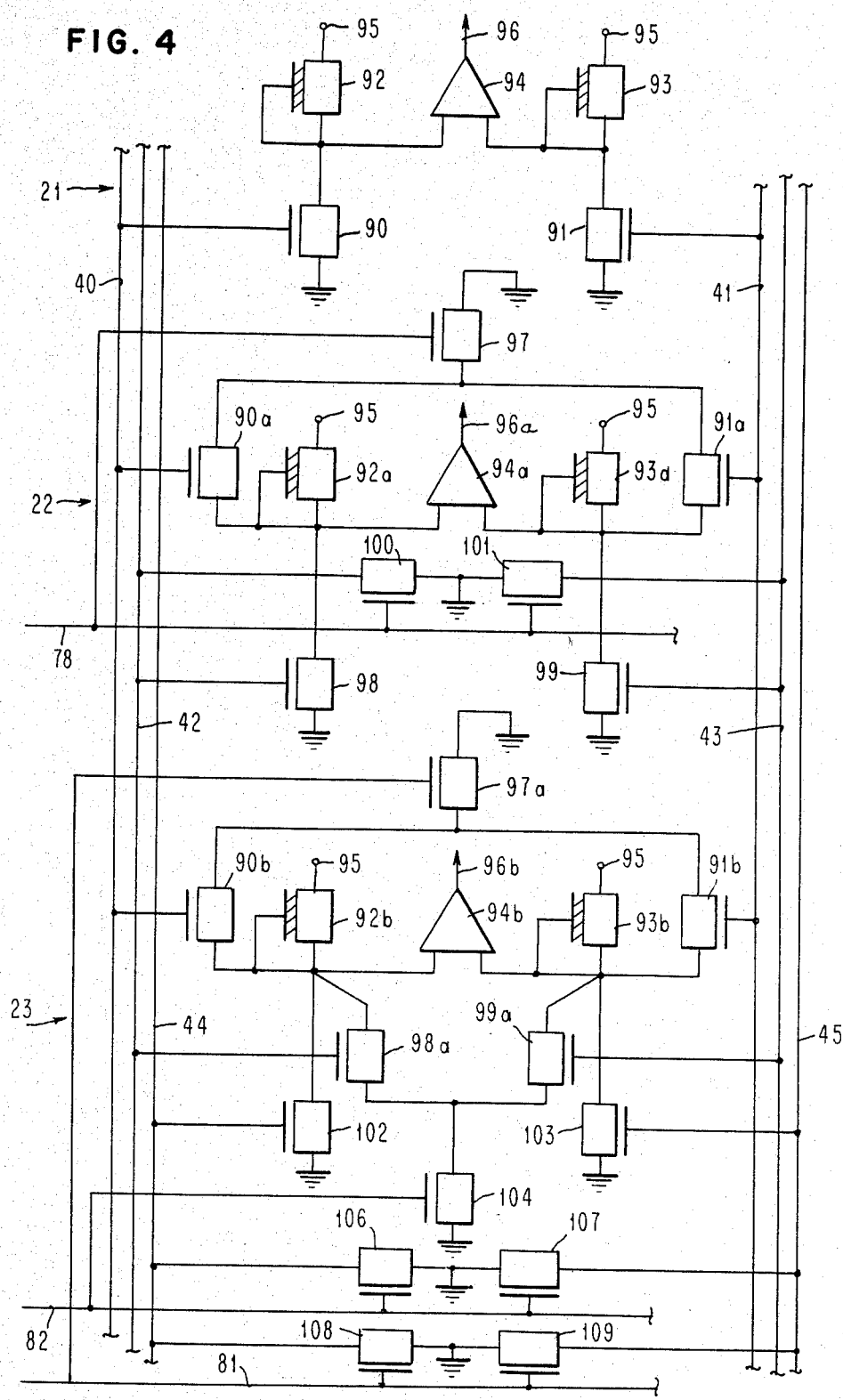
FIG. 4 illustrates a preferred embodiment of a read circuit for use in FIG. 1.

Turning now to FIG. 4, the read heads 21, 22 and 23 and their associated multiplexer circuits, suitable for use in the invention, will be described in detail.

Read head 21 comprises a pair of bit line read transistors 90 and 91 whose gates are coupled to differential bit lines 40 and 41 respectively. The sources of both transistors 90 and 91 are coupled to ground. The drain of transistor 90 is coupled through a load transistor 92 to a voltage source 95 while the drain of transistor 91 is coupled through another load transistor 93 to the voltage source 95. The drains of transistors 90 and 91 are both coupled to an output amplifier; in this example there is shown a differential amplifier 94. This amplifier 94 has a low impedance source and is generally referred to as a powering block. This differential amplifier 94 is well known to the art and need not be further described. Its output is coupled to an output read line 96 and is activated whenever bit line devices 34 and 35 are turned on, by activation of word line 46. As noted previously activation of these bit line devices causes the differential signal from the cell devices 30 and 31 to appear on the bit lines 40 and 41 respectively. This differential signal turns on one or the other read transistor 90 or 91 causing the amplifier 94 to emit a suitable signal. Thus, read head 21 is typical to those known to the prior art.

Read head 22 is similar, and has a set of read transistors 98 and 99 whose gates are coupled to read lines 42 and 43. The gates of read transistors 98 and 99 are coupled to the bit lines 42 and 43 respectively, their sources are connected to ground, and their drains to the voltage source 95 through the load transistors 92a and 93a respectively, and to the differential amplifier 94a. In addition, read head 22 is provided with a multiplexer circuit comprising a second set of read transistors 90a and 91a whose gates are coupled to differential bit lines 40 and 41 respectively and whose sources are coupled to ground through a switching transistor 97 and whose drains are coupled through respective load transistors 92a and 93a to the voltage source 95 and to a differential amplifier 94a and to an output read line 96a. In addition to these devices, this multiplexer circuit is provided with two inhibit devices 100, and 101. Inhibit devices 100 and 101 have their drains coupled to the bit lines 42 and 43 respectively and their sources coupled to ground. Their gates are coupled to the inhibit line 78 coming from the comparator circuit 24. Also coupled to this inhibit line 78 from the comparator circuit 24 is the gate of switching transistor 97 whose source is grounded and whose drain is coupled through transistors 90a and 91a to the read head 94a.

If the address sets P1 and P2 are different then both sets of bit lines 40 and 41; and 42 and 43 have signals thereon, although from different cells as noted previously. In this case read head 21 operates as described above. These signals also try to turn on one or the other of the read transistors 90a and 91a, as well as one or the other of transistors 98 and 99. In this case, however, only one or the other read transistors 98 and 99 turn on causing read head 22 to read only lines 42 and 43 which are carrying information from a different cell. Neither one of read transistors 90a and 91a can turn on since their sources are insulated from ground by switching transistor 97 which is not turned on.

Thus, the read head 22 is prevented from reading more than one set of bit lines.

When the addresses P1 and P2, that call for the information on both word lines is identical a comparison would be made in comparator circuit 24 causing line 78 to be positive. When line 78 goes positive not only is the address decoder 50 shut off, which in turn shuts off the bit line devices 36 and 37, but the gates of inhibit devices 100 and 101 go positive turning these devices on grounding the bit lines 42 and 43. Because of this grounding of the bit lines 42 and 43, the devices 98 and 99 do not turn on.

Simultaneously, the positive signal on line 78 causes the switching transistor 97 to turn on coupling the sources of transistors 90a and 91a to ground. When this occurs any signals on the bit lines 40 and 41 causes one or the other of read transistors 90a and 91a to turn on causing the amplifier 94a to turn on and emit the same signal as amplifier 94 is emitting.

In this way both read heads 94 and 94a can turn on and provide a signal. Since only one pair of bit line devices 34 and 35 turn on current flow through the memory devices 30 and 31 is minimized. Thus, the multiplexer has switched the data of the cell appearing on bit lines 40 and 41 to the output read line 96a which has the same address as the undisabled word decoder 49.

Read head 23 is similar and has a set of read transistors 102 and 103 which are respectively coupled to bit lines 44 and 45, their sources coupled to ground and their drains to the voltage source 95 through the load transistors 92b and 93b respectively, and to the differential amplifier 94b to output line 96b.

In addition, read head 23 is provided with two multiplexer circuits. The first multiplexer circuit comprises switching transistor 97a, read transistors 90b, 91b and inhibit transistors 108 and 109. Transistors 97a, 108 and 109 have their gates coupled to the inhibit line 81 from comparator circuit 25. Transistors 108 and 109 are coupled between ground and between bit lines 44 and 45 respectively. Switching transistor 97a is coupled to ground and to the read transistors 90b and 91b whose gates are connected respectively to bit lines 40 and 41 and whose drains are coupled to the differential amplifier 94b. The second multiplexer circuit comprises a switching transistor 104, a pair of read transistors 98a and 99a, whose gates are respectively coupled to bit lines 42 and 43, and inhibit transistors 106 and 107. The gates of transistors 104, 106 and 107 are coupled to the inhibit line 82 from comparator circuit 26. Transistor 106 and 107 are coupled between ground and between bit lines 44 and 45 respectively. Transistor 104 is coupled to ground and to the read transistors 98a and 99a whose gates are connected respectively to lines 42 and 43 and whose drains are coupled to the differential amplifier 94b.

If a positive signal is applied to line 81 from comparator circuit 25, due to a comparison between address sets P1 and P2 devices 108a and 109a are turned on causing the bit lines 44 and 45 to become grounded and thus inhibited. Simultaneously transistor 97a is turned on permitting current to pass through either transistors 90b and 91b depending on the signals on the bit lines 40 and 41, and activating the differential amplifier 94b. A signal on the line 82 from the comparator circuit 26 will perform a similar function, however in this case, the information on line 82 turns on inhibit transistors 106 and 107, also grounding the bit lines 44 and 45. Simultaneously this turns on transistor 104 which turns on transistors 98a and 99a which detects the signal on the bit line of 42 and 43. It should be noted that if a comparator signal was also being simultaneously detected on line 78 that the lines 42 and 43 would be grounded by the inhibit transistors 100 and 101. In such a case the turning on of transistors 98a and 99a would be of no effect since the bit lines 42 and 43 would have been grounded by inhibit transistors 100 and 101.

As noted above, this read head is thus provided with two multiplexer circuits. If, for example, a four port system was contemplated, the system, of course, would require not only a fourth pair of bit lines and a fourth decoder, but also three additional comparator circuits, sufficient to compare all the input addresses and a fourth read head having associated therewith three multiplexer circuits. Thus, each additional higher order read head must have one multiplexer circuit more than the preceeding read head.

If the address sets P1, P2 and P3 are all different then all three sets of bit lines 40 and 41; and 42 and 43; and 44 and 45 have signals thereon. In this case read heads 21, 22 and 23 would each be operating in its normal mode, i.e., head 21 would be reading the signals on bit lines 40 and 41, head 22 would be reading the information on bit lines 42 and 43, and head 23 would be reading the information on bit lines 44 and 45.

In head 23 only the signals on the bit lines 44 and 45 would be detected since only devices 102 and 103 are directly connected to ground and thus can be turned on. The other read devices 98a, 99a, 90b and 91b are all isolated from ground and thus inactive.

Thus, the read head is prevented from reading more than one set of bit lines.

Now when addresses P1 and P3 are identical a comparison would be made in comparator 25 causing line 81 to be positive. When line 81 goes positive not only is the address decoder 51 shut off, shutting off word line 48 and bit line devices 38 and 39, but also the gates of the inhibit devices 108 and 109 go positive turning on these devices and grounding the bit lines 44 and 45. Because of this grounding of the bit lines 44 and 45 the head devices 102 and 103 cannot turn on.

Simultaneously, however, device 97a is turned on providing a path to ground for read devices 90b and 91b so that they may now become active transmitting the detected bit line signal to the amplifier 94b.

Similarly, when addresses P2 and P3 are comparable the bit lines 44 and 45 are grounded through devices 106 and 107 and device 104 is turned on permitting read devices 98a and 99a to turn on. Switching transistor 97a is off and read transistors 90b and 91b are inactive.

If all three address signal sets are identical then both inhibit lines 81 and 82 are on grounding the bit lines 44 and 45 through devices 106, 107, 108 and 109 and turning on switching transistor 97a and 104. In this case, however, inhibit line 78 leading to read head 22 would also be positive and grounding the bit lines 42 and 43 through inhibit devices 100 and 101. Because of this grounding of bit lines 42 and 43 the switching on of transistor 104, in read head 23, would be of no effect since no signals would be received by the gates of devices 98a and 99a and these devices would not turn on. In this case where all address sets are the same all the read heads would be reading the bit lines 40 and 41 only.

It should, of course, be obvious to one skilled in the art that such a technique can be extended to any size array and that for more output ports more read heads and multiplexers would be required.

It should also be obvious to one skilled in the art that although the array of the preferred embodiment has been described as having differential bit line pairs that a single ended bit line arrangement could be readily used and that adaptation in the read heads and multiplexers to accommodate such single ended bit line arrays can be readily accomplished.

Thus, there has been described a technique for preventing multiple reads in multiport register arrays which greatly reduces array size and improves performance. Basically the technique as described is implemented by adding address compares together with inhibit and transfer operations in the word and read head areas. Typical circuitry has been found to show a substantial area decrease in circuitry required and improved reliability of the circuitry.

While the invention has been particularly described with reference to the preferred embodiments thereof, it will be understood by those skilled in the art that changes in form and details can be made in the foregoing preferred embodiments without departing from the spirit and scope of the invention.

What is claimed is:

1. In a memory array having cells each of which is separately addressable from a plurality of write lines and is readable by a plurality of sets of bit lines, comprising:
   a memory cell array, each cell of which is separately addressable from a plurality of write lines and readable by a plurality of sets of bit lines,
   a low order word decoder and at least one high order word decoder coupled to each cell of the array,
   a low order read head and at least one high order read head coupled to each cell of the array, via said plurality of bit lines, the number of said high order read heads being equal in number to the number of high order word decoders,
   at least one multiplexer circuit coupled to each of said high order read heads,
   address comparison means coupled to each of said high order word decoders and to each of said high order read heads and
   means for applying a respective one set of a plurality of sets of addresses to each respective word decoder, and all of said sets of addresses to said address comparison means,
   said address comparison means comparing said sets of addresses.

2. The memory array of claim 1 wherein said address comparison means, in the event of a compare between said addresses, provides a signal to said high order word decoders to disable selected ones of said high order word decoders and inhibit selected ones of said high order read heads from reading more than one set of simultaneously addressed bit lines from the cell while switching the inhibited high order read heads to output read lines having the same address as the low order word decoder.

3. The memory array of claim 1 wherein each of said sets of bit lines comprises a differential pair of bit lines, and each of said read heads comprises a pair of read transistors, each of which is coupled to one of said pair of bit lines and to a differential amplifier, said differential amplifier being coupled to an output read line.

4. The memory array of claim 1 wherein said comparison means comprises:
a plurality of cross coupled exclusive OR circuits each of which has its inputs coupled to respective address bits and has its output coupled to an NOR circuit.

5. The memory array of claim 4 wherein said exclusive OR is formed of an exclusive NOR provided with an inverter between each of said exclusive NOR circuits and said NOR circuit.

6. The memory array of claim 1 wherein each of said read heads comprises an output amplifier and a read transistor coupled to a respective bit line set and to said output amplifier.

7. The memory array of claim 1 wherein said multiplexer circuit comprises:
means for inhibiting the bit line set coupled to said read head, and
means for transferring an input to said low order read head to the output amplifier of the read head to which the multiplexer is coupled.

8. The memory array of claim 1 wherein said low order read head and said high order read heads are arranged serially,
said low order read head being the first in said series, each of said high order read heads being coupled to one multiplexer more than the number of multiplexers to which the preceding read head is coupled.

9. In a memory array which is separately addressable from a plurality of write lines and readable by a plurality of bit lines comprising:
a memory array having a plurality of cells,
a plurality of sets of word decoders coupled to the array, each word decoder having a plurality of input address lines coupled thereto,
a plurality of sets of high and low order read heads equal in number to the number of word decoders coupled to each cell of the array, and having a plurality of output read lines equal to the number of said word decoders,
at least one multiplexer, coupled to each of the high order read heads, and
a plurality of comparator means for comparing address inputs applied to said input address lines coupled to the word decoders, said comparator means being coupled to the word decoders and the multiplexers and in the event of a compare disabling selected ones of word decoders, and inhibiting selected ones of the read heads, from reading selected ones of said bit lines,
said multiplexer switching the output data of the cell to output read lines having the same address as said uninhibited one of said word decoders.

10. In a memory array which is separately addressable from a plurality of write lines and readable by a plurality of sets of bit lines comprising:
a memory array having a plurality of cells,
a plurality of word decoders coupled to each cell of the array, each word decoder having a plurality of input address lines coupled thereto,
a plurality of read heads equal in number to the number of word decoders coupled to the cell of the array and comprising both high order and low order read heads, and
a multiplexer, coupled to each of the higher order read heads,
characterized by comparator means coupled to the word decoders and the multiplexer for comparing address inputs on said address lines to the word decoders and in the event of a compare disabling selected ones of the word decoders, and disabling selected ones of the higher order read heads,
said multiplexer switching the output data of the cell to output read lines having the same address as said uninhibited one of said word decoders.

* * * * *